(12) United States Patent
Adkins

(10) Patent No.: US 8,552,753 B2
(45) Date of Patent: Oct. 8, 2013

(54) CIRCUITS AND METHODS FOR SENSING RESISTANCE

(75) Inventor: Kenneth C. Adkins, Mason, OH (US)

(73) Assignee: QUALCOMM Incorporated, San Diego, CA (US)

( * ) Notice: Subject to any disclaimer, the term of this patent is extended or adjusted under 35 U.S.C. 154(b) by 410 days.

(21) Appl. No.: 12/946,463

(22) Filed: Nov. 15, 2010

(65) Prior Publication Data

US 2012/0119763 A1    May 17, 2012

(51) Int. Cl.
*G01R 27/08*    (2006.01)
(52) U.S. Cl.
USPC ............................ 324/705; 324/691; 324/713
(58) Field of Classification Search
None
See application file for complete search history.

(56) References Cited

U.S. PATENT DOCUMENTS 4,987,372 A * 1/1991 Ofori-Tenkorang et al. . 324/705
6,825,490 B1 * 11/2004 Hook et al. ..................... 257/48

\* cited by examiner

*Primary Examiner* — Minh N Tang
(74) *Attorney, Agent, or Firm* — Fountainhead Law Group, P.C.

(57) ABSTRACT

Embodiments of the present invention include circuits and methods for sensing resistance. In one embodiment, a current is generated into a node. The node is coupled to a first terminal of a resistor. A second terminal of the resistor is coupled in series with a capacitance and a reference voltage. The current is turned off when a voltage on the node meets a threshold. A second voltage is detected on the node after the current is turned off. A resistance value is determined based on the first voltage on the node and the second voltage on the node. In one embodiment, the resistor is external to an integrated circuit and sensed through a single pin of the integrated circuit. The integrated circuit may include a current source, comparator, and a digital-to-analog converter.

20 Claims, 5 Drawing Sheets

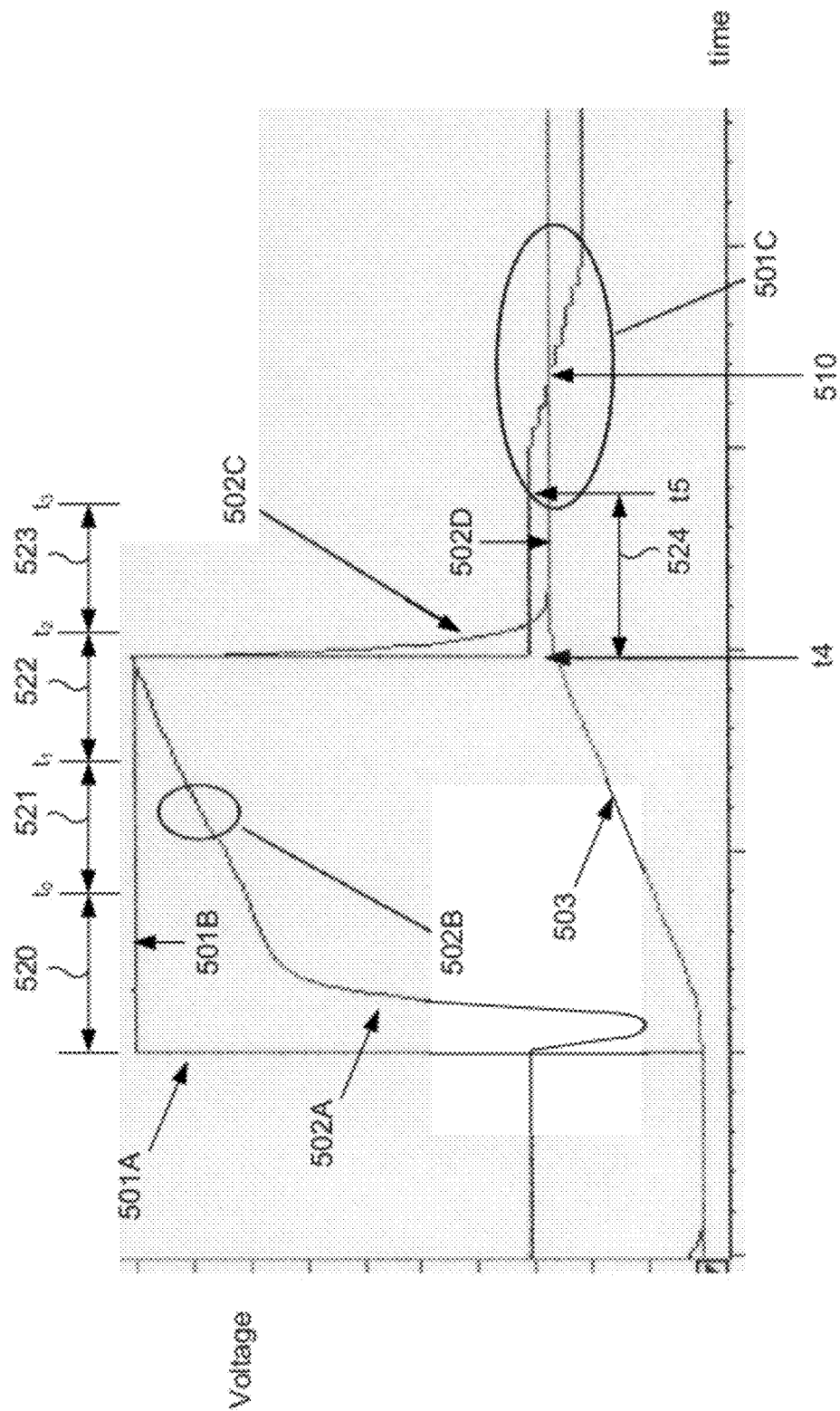

CIRCUITS AND METHODS FOR SENSING RESISTANCE

BACKGROUND

The present invention relates to electronic circuits, and in particular, to circuits and methods for sensing resistance.

One common component of an electronic circuit is a resistor. When current flows through a resistor, a voltage is created according to Ohm's Law: V=IR, where V is voltage, I is current, and R is the resistance value of a resistor. Resistors are found in a broad range of applications in circuits. Different resistors typically have a different resistance depending on the application. Resistance is often used in electronic circuits as a parameter to control certain behaviors of the electronic circuit and surrounding system.

Some electronic circuits may sense a particular resistance during operation to control operating conditions. Typically, resistance may be sensed by measuring a voltage on opposite terminals of the resistor. However, both terminals of the resistor must be available for this type of measurement. Embodiments of the present invention include an improved circuits and methods for sensing resistance.

SUMMARY

Embodiments of the present invention pertain to circuits and methods for sensing resistance. In one embodiment, the present invention includes a method comprising generating a current into a node, wherein the node is coupled to a first terminal of a resistor, and wherein a second terminal of the resistor is coupled in series with a capacitance and a reference voltage, turning off the current when a voltage on the node meets a threshold, the threshold corresponding to the voltage on the node having a first voltage, detecting a second voltage on the node after the current is turned off, and determining a resistance value of said resistor based on the first voltage on the node and the second voltage on the node.

In one embodiment, the current is generated by an integrated circuit, and wherein the resistor and the capacitance are external to the integrated circuit.

In one embodiment, the integrated circuit is coupled to the resistor through a single pin of the integrated circuit.

In one embodiment, the method further comprises configuring a digital-to-analog converter to generate a third voltage, wherein the third voltage sets said threshold and comparing the third voltage to the voltage on the node when the current is being generated into said node, and in accordance therewith, turning off the current when the voltage on the node has said first voltage equal to said third voltage.

In one embodiment, said detecting the second voltage on the node comprises configuring a digital-to-analog converter to generate a plurality of voltages and comparing the plurality of voltages to the voltage on the node.

In one embodiment, the plurality of voltages are generated on a single output of the digital-to-analog converter, the plurality of voltages changing from an initial voltage to a final voltage, wherein the final voltage occurs after the plurality of voltages crosses the voltage on the node.

In one embodiment, the method further comprises generating a third voltage based on first digital bits, wherein the third voltage sets said threshold, comparing the third voltage to the voltage on the node when the current is being generated into said node, and in accordance therewith, turning off the current when the voltage on the node has said first voltage equal to said third voltage, generating a plurality of voltages based on a plurality of digital bits, comparing the plurality of voltages to the voltage on the node, wherein the second voltage is detected based on a crossover voltage of the plurality of voltages and the voltage on the node, the detected second voltage corresponding to second digital bits, wherein determining the resistance is based on a difference between the first digital bits and the second digital bits.

In one embodiment, the method further comprises detecting a time period between starting the current into the node and turning off the current when the voltage on the node meets the threshold and turning off the current, increasing the threshold, and restarting the current if the time period is less than a first predefined time period.

In one embodiment, the method further comprises detecting a time period between starting the current into the node and turning off the current when the voltage on the node meets the threshold and changing the threshold if the time period is outside a predefined time window.

In one embodiment, the method further comprises waiting a period of time between turning off the current and detecting the second value of the voltage on the node.

In one embodiment, the present invention includes a resistance sensing circuit comprising a current source to generate a current into a node, wherein the node is coupled to a first terminal of a resistor, and wherein a second terminal of the resistor is coupled in series with a capacitance and a reference voltage, a threshold detection circuit coupled to the voltage on the node and to the current source, wherein the threshold detection circuit turns off the current when a voltage on the node meets a threshold, the threshold corresponding to a first voltage on the node, and a voltage measurement circuit coupled to the voltage on the node to detect a second voltage on the node after the current is turned off, wherein a difference between the first voltage on the node and the second voltage on the node corresponds to a resistance value of said resistor.

In one embodiment, the resistance sensing circuit is an integrated circuit, and the resistor and the capacitance are external to the integrated circuit.

In one embodiment, the integrated circuit is coupled to the resistor through a single pin of the integrated circuit.

In one embodiment, the threshold detection circuit comprises a digital-to-analog converter configured to generate a third voltage, wherein the third voltage sets said threshold and a comparator to compare the third voltage to the voltage on the node when the current is being generated into said node, and in accordance therewith, turning off the current when the voltage on the node has said first voltage equal to said third voltage.

In one embodiment, the voltage measurement circuit comprises a digital-to-analog converter configured to generate a plurality of voltages and at least one comparator to compare the plurality of voltages to the voltage on the node after the current is turned off.

In one embodiment, the plurality of voltages are generated on a single terminal of the digital-to-analog converter that changes from an initial voltage and a final voltage, wherein the final voltage occurs after the voltage on the single terminal crosses the voltage on the node.

In one embodiment, the threshold detection circuit and voltage measurement circuit comprise a digital-to-analog converter and a comparator. When the current is being generated into said node, the digital-to-analog converter generates a third voltage based on first digital bits, wherein the third voltage sets said threshold and the comparator compares the third voltage to the voltage on the node, and in accordance therewith, turns off the current when the voltage on the node has said first voltage equal to said third voltage. After the current is turned off, the digital-to-analog converter generates a plurality of voltages based on a plurality of digital bits and the comparator compares the plurality of voltages to the voltage on the node, wherein the second voltage is detected based on a crossover voltage of the plurality of voltages and the voltage on the node, the detected second voltage corresponding to second digital bits.

In one embodiment, the circuit further comprises a timer to detect a time period between starting the current into the node and turning off the current when the voltage on the node meets the threshold. If the time period is less than a first predefined time period, the current is turned off, the threshold is increased, and the current is restarted.

In one embodiment, the circuit further comprises a timer to detect a time period between starting the current into the node and turning off the current when the voltage on the node meets the threshold. If the time period is outside a predefined time window, the threshold is changed.

In one embodiment, the circuit further comprises a timer to wait a period of time between turning off the current and detecting the second value of the voltage on the node.

The following detailed description and accompanying drawings provide a better understanding of the nature and advantages of the present invention.

BRIEF DESCRIPTION OF THE DRAWINGS

FIG. 5 illustrates an example implementation of a method according to another embodiment of the present invention.

DETAILED DESCRIPTION

Described herein are techniques for circuits and methods of sensing resistance. In the following description, for purposes of explanation, numerous examples and specific details are set forth in order to provide a thorough understanding of the present invention. It will be evident, however, to one skilled in the art that the present invention may include some or all of the features in these examples alone or in combination with other features described below, and may further include modifications and equivalents of the features and concepts described herein.

Figure 1:
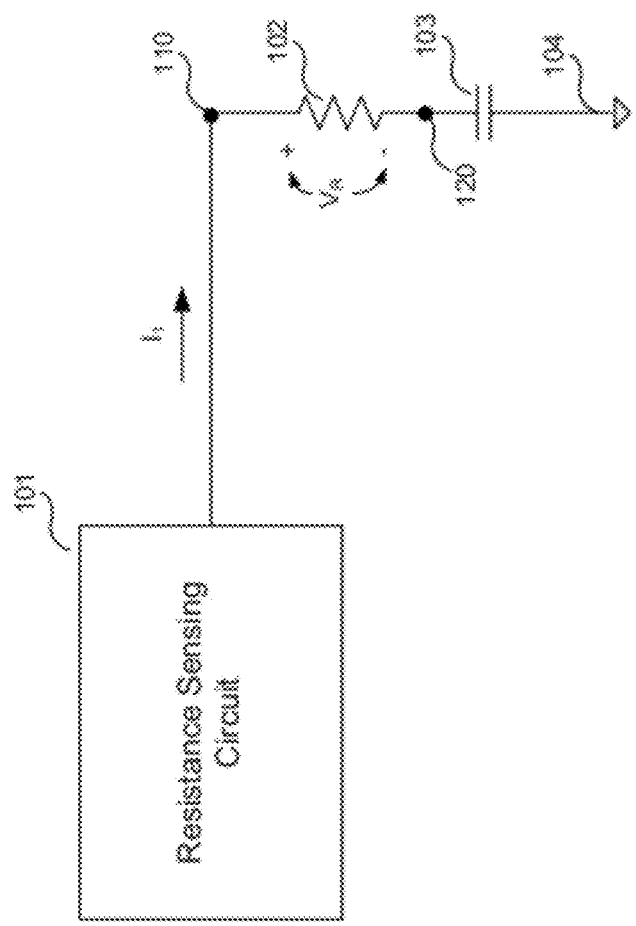
FIG. 1 illustrates a resistance sensing circuit according to one embodiment of the present invention.

FIG. 1 illustrates a resistance sensing circuit according to one embodiment of the present invention. Resistance sensing circuit 101 is coupled to a first terminal of a resistor 102. A second terminal of resistor 102 is coupled in series with a capacitance and a reference voltage. Specifically, in this example, a second terminal of resistor 102 is coupled to node 120, which is coupled to a first terminal of capacitance 103. A second terminal of capacitance 103 is coupled to a reference voltage 104, such as ground. It is to be understood that capacitance 103 may be a capacitor or a capacitance associated with one or more electronic components. The techniques describe herein are applicable to a resistance that is series connected with a capacitance and reference voltage as shown in this example as well as a resistance that is connected to equivalent capacitance and reference voltage configurations.

Embodiments of the present invention include generating a current, I1, from resistance sensing circuit 101 into a node 110. Node 110 is coupled to a first terminal of resistor 102. When the current begins to flow into node 110 and the first terminal of resistor 102, a voltage Vr is generated across the resistor. The voltages resulting from the current into node 110 will now be described.

Figure 2:
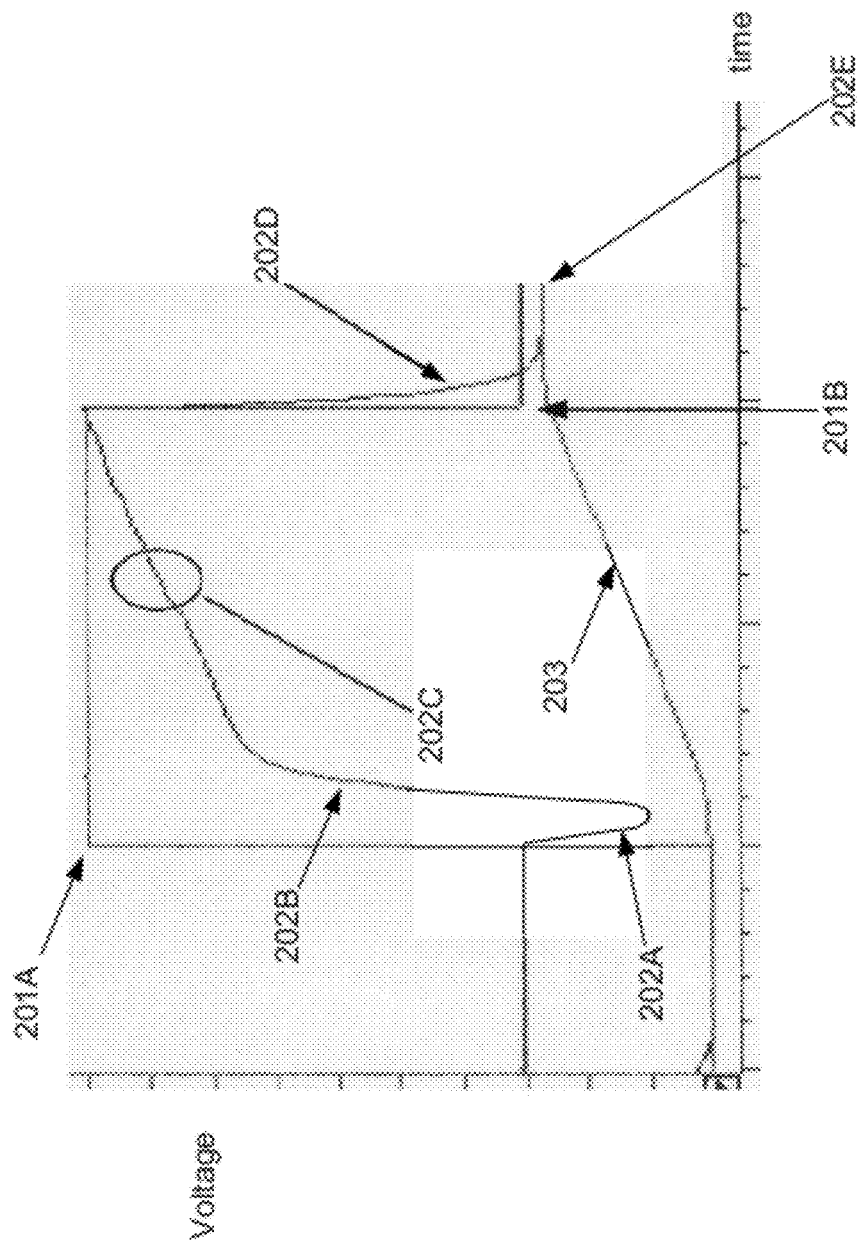
FIG. 2 illustrates a method according to one embodiment of the present invention.

FIG. 2 illustrates a method according to one embodiment of the present invention. FIG. 2 illustrates three waveforms 201-203. Waveform 201A-B is an illustrative waveform showing the start of the current from circuit 101 into node 110. Waveform 202A-D illustrates the voltage on node 110. Waveform 203 illustrates the voltage on node 120 between capacitance 103 and reference voltage 104. Current into node 110 is started at 201A as illustrated by waveform 201 going high. Waveform 201 may set the threshold, for example. When current starts to flow, the voltage at node 110 may initially drop as illustrated at 202A and then sharply increase as illustrated at 202B. The voltage on node 110 will settle out as a linearly increasing voltage as illustrated at 202C, where the slope of the curve is proportional to the capacitance 103 and the current I1. As illustrated by waveform 203, the voltage on node 120 will also begin to increase linearly. When the voltage on the node meets a threshold set at 201A the current is turned off This is illustrated at 201B. The threshold corresponds to the voltage on the node having a first voltage. After the current is turned off, the voltage on node 110 will drop as illustrated at 202D and become equal to the voltage on node 120 because there is no current flowing through the resistor 102. The voltage on node 110 converges with the voltage on node 120 at 202E. At this point, resistance sensing circuit 101 may detect a second voltage on node 110 after the current is turned off. The resistance value of resistor 102 maybe determined based the first voltage on the node and the second voltage on the node. For example, using Ohm's Law, the resistance R may be determined as follows:

$$R=(V1-V2)/I1,$$

wherein V1 is the first (initial) voltage of node 110 when the voltage meets the threshold with current flowing in resistor 102 and the V2 is the second (final) voltage after the current is turned off.

Some embodiments of the present invention may perform the resistance measurement multiple times to determine variations in the resistance. In this case, the circuit may wait a period of time between consecutive resistance measurement cycles, for example, to return the voltage across the capacitor back to a particular voltage. For instance, after a resistance measurement cycle is complete, node 110 may be grounded for a period of time to discharge node 120 to close to zero volts, for example.

Figure 3:
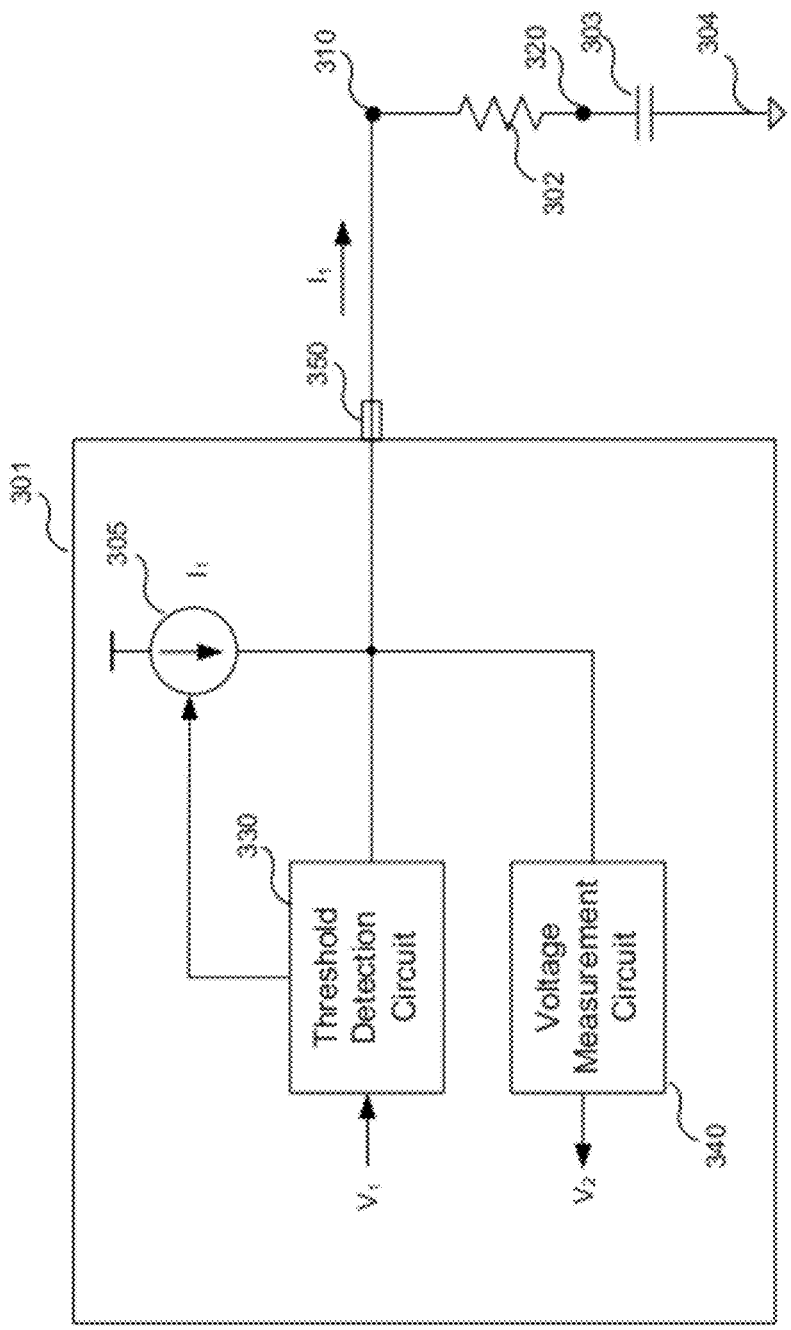
FIG. 3 illustrates a circuit according to another embodiment of the present invention.

FIG. 3 illustrates a circuit according to another embodiment of the present invention. Embodiments of the present invention may include an integrated circuit 301. Integrated circuit 301 includes a pin 350 coupled to node 310. As used herein, the term pin refers to an electrical connection between integrated circuit 301 and other electronic components external to integrated circuit 301 and includes lead frame pins, solder bumps, and any other connection between integrated circuit 301 and external components. Here, resistor 302 is external to the integrated circuit. Accordingly, pin 350 is coupled to a first terminal of resistor 302. A second terminal of resistor 302 is coupled in series with a capacitance 303 and a reference voltage 304, which may be a voltage source of an electronic circuit set to ground, for example. Integrated circuit 330 includes a current source 305 coupled to node 310 through pin 350, a threshold detection circuit 330 having an input coupled to node 310 through pin 350 and an output coupled to current source 305, and a voltage measurement circuit 340 having an input coupled to node 310 through pin 350.

Referring again to FIG. 2, current source 305 may generate current into node 310 and resistor 302. When the voltage on the node begins to increase linearly at 202C of FIG. 2, the voltage on node 310 may be compared to a threshold using threshold detection circuit 330. When the voltage on node 310 meets a threshold (e.g., when the voltage on node 310 is at a first voltage), then threshold detection circuit 330 may turn off current source 305. When current source 305 is turned off, the voltage on node 310 drops to a second voltage at 202E in FIG. 2. Voltage measurement circuit 340 may detect the second voltage on node 310 after the current is turned off. As illustrated in FIG. 3, the threshold may be set by voltage V1, which corresponds to the first voltage where the current source is turned off Similarly, the detected second voltage is shown as V2 in FIG. 3. A resistance value of resistor 302 may be determined based on V1 and V2 as described above.

Figure 4:
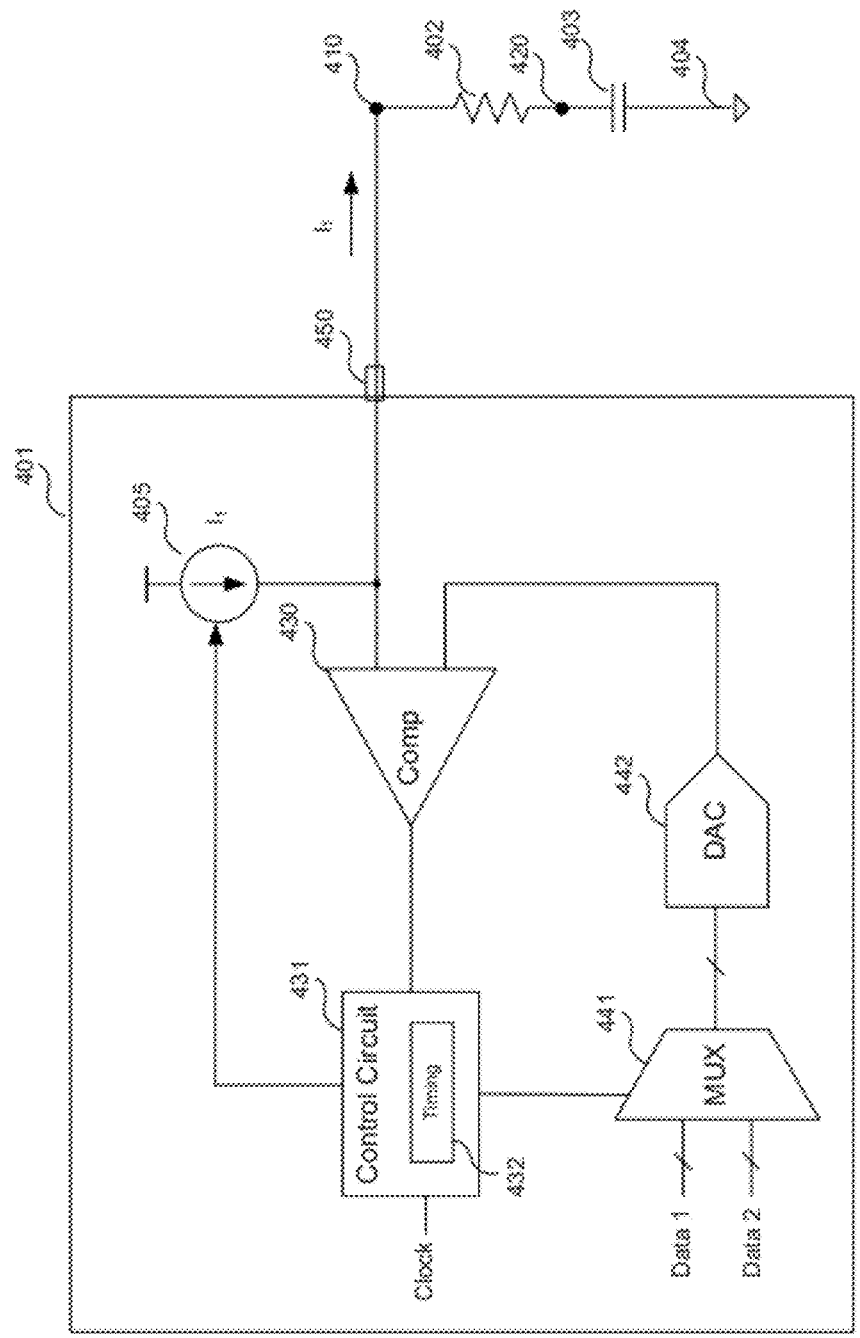
FIG. 4 illustrates an example implementation of a circuit according to another embodiment of the present invention.

FIG. 4 illustrates an example implementation of a circuit according to another embodiment of the present invention. In this example, an integrated circuit 401 includes a current source 405 coupled to an external resistor 402 through pin 450. Resistor 402 is coupled in series with capacitance 403 and constant reference voltage 404. In this example, the threshold detection circuit and voltage measurement circuit use a comparator 430, digital-to-analog converter ("DAC") 442, and multiplexer ("MUX") 441. A control circuit 431 configures MUX 441 into a first state to detect when a voltage on node 410 meets a threshold. Control circuit 431 configures MUX 441 into a second state to generate a plurality of voltage in DAC 442 to measure the voltage on node 410 after the current is turned off. The operation of the circuit shown in FIG. 4 is illustrated by the waveform diagram of FIG. 5. Using the same comparator for both threshold detection and voltage measurement may be advantageous in some implementations because offset and other errors may be canceled.

FIG. 5 illustrates an example implementation of a method according to another embodiment of the present invention. FIG. 5 illustrates waveforms 501A-D. Control circuit 431 may activate current source 405 to generate current I1 into node 410 through pin 450. Initially, the voltage on node 410 experiences an IR jump in voltage as current flows into resistor 402 as shown at 502A. The voltage on node 410 will then begin to increase linearly with current as shown at 502B. The voltage on node 410 is further coupled to one input of comparator 430 through pin 450. Waveform 501A-C illustrates the voltage generated by DAC 442. Control circuit 431 may configure MUX 441 to couple first digital bits (Data1) to a digital input of DAC 442 when current is turned on. Data1 may be converted into a DAC voltage, which in turn is coupled to a second input of comparator 430. The DAC voltage generated by the first digital bits sets the threshold on comparator 430. When the voltage on node 410 meets the threshold, the comparator will change state. Comparator 430 may generate a digital output, for example, and control circuit may include a latch (not shown) to capture the output of comparator 430. Thus, the comparator 430 changes state when the voltage on node 410 is approximately equal to the DAC voltage as set by Data1.

Control circuit 431 detects the change of state of comparator 430 and turns off current source 405. In this example, control circuit 431 configures MUX 441 when comparator 430 changes state so that MUX 441, DAC 442, and comparator 430 are configured as a voltage measurement circuit. As illustrated by waveform 503, the voltage on node 420 tracks the voltage on node 410. When the current is turned off, there is voltage drop across resistor 402 goes to zero and the voltage on node 410 converges with the voltage on node 420. The voltage on node 410 is then detected after the current is turned off. For example, MUX 441 is configured to couple changing digital bits (Data2) to a digital input of DAC 442 when current is turned off. Data2 generates a plurality of voltages at the output of DAC 442 that are compared against the voltage on node 410. In one embodiment, Data2 may cycle through a plurality of digital values to change the voltage at the output of DAC 442. Data2 may be received from a local or external memory, for example, or Data2 may be generated locally (e.g., using a pre-configured up or down counter). In this example, the plurality of voltages are generated at the output of DAC 442 that changes from an initial voltage to a final voltage as illustrated at 501C. The final voltage occurs after the plurality of voltages crosses the voltage on the node as illustrated at 510 in FIG. 5. The crossover voltage may correspond to two digital bit sequences and two corresponding voltages generated by DAC 442, where the first DAC voltage is above the voltage on the node and the second DAC voltage is below the voltage on the node. When the crossover voltage is reached, comparator 430 changes state indicating that the voltage generated by DAC 442 has cross the voltage on node 410. The final voltage on DAC 442 is generated by second digital bits that correspond to the voltage on node 410 after the current is turned off. Accordingly, since the voltage on node 410 corresponds to the first digital bits setting the threshold, and since the voltage on node 410 after the current is turned off corresponds to second digital bits at the crossover voltage, then the resistance may be determined based on a difference between the first digital bits and the second digital bits. In one embodiment, DAC 442 is a switched resistor DAC (e.g., 8-bits) and the resistors may be scaled to give the appropriate range so that the first and second digital bits may be subtracted to obtain the resistance of resistor 402. It is to be understood that a variety of search algorithms may be used for detecting the voltage on node 410 after the current is turned off While the example above illustrates a linear search, other searches may be used.

In one embodiment, circuit 401 includes timing circuit 432, which is depicted here as part of control circuit 431, for example. As illustrated in FIG. 5, embodiments of the present invention may include a plurality of time windows 520, 521, 522, 523, and 524. Time windows may be used to detecting time periods between circuit states and controlling the timing of measurements. For example, a first time period between starting the current into the node and turning off the current when the voltage on the node meets the threshold may be detected. Referring to FIGS. 4 and 5, when control circuit turns on current source 405 a timer in timing circuit 432 may be started. If comparator 430 changes state between the time the current turns on and time t0 in time window 520, the system may signal a faulty measurement, for example, to ensure that the resistor 402 is in the linear region at 502. In this condition, control circuit may turn off the current, increase the threshold (e.g., by changing the digital bits for Data1), and restarting the current to redo the measurement. Similarly, a time period between starting the current into node 410 and turning off the current when the voltage on the node meets the threshold may be detected using time windows 521, 522, and 523. For instance, it may be desirable to ensure that comparator 430 is tripped only after a certain time period has passed. If comparator 430 is tripped in time windows 521 or 523 (e.g., outside time window 522), then the threshold is changed. Specifically, if comparator 430 is tripped in time window 521, the threshold is increased, and if comparator 430 is tripped in time window 523, the threshold is decreased.

In one embodiment, timer circuit 432 may be used to wait a period of time between turning off the current and detecting the second value of the voltage on the node. For example, as illustrated in FIG. 5, at time t4 the comparator is tripped and the current is turned off. Embodiments of the present invention may include a wait period before applying Data2 to DAC 442 to determine the voltage on node 410 after the current is off. After comparator 430 changes state indicating the threshold has been met, control circuit 431 may activate a timer (e.g., a counter) in timer circuit 432 and the system may wait until the timer has lapsed to begin providing Data2 to DAC 442, for example. FIG. 5 illustrates the wait time window 524 between t4 and t5. Voltage measurement may occur after time t5, for example, to ensure that the voltage on node 410 has settled.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method comprising:
   generating a current into a node, wherein the node is coupled to a first terminal of a resistor, and wherein a second terminal of the resistor is coupled in series with a capacitance and a reference voltage;
   turning off the current when a voltage on the node meets a threshold, the threshold corresponding to the voltage on the node having a first voltage;
   detecting a second voltage on the node after the current is turned off; and
   determining a resistance value of said resistor based on said current, the first voltage on the node and the second voltage on the node.

2. The method of claim 1 wherein the current is generated by an integrated circuit, and wherein the resistor and the capacitance are external to the integrated circuit.

3. The method of claim 2 wherein the integrated circuit is coupled to the resistor through a single pin of the integrated circuit.

4. The method of claim 1 further comprising:
   configuring a digital-to-analog converter to generate a third voltage, wherein the third voltage sets said threshold; and
   comparing the third voltage to the voltage on the node when the current is being generated into said node, and in accordance therewith, turning off the current when the voltage on the node has said first voltage equal to said third voltage.

5. The method of claim 1, said detecting the second voltage on the node comprising:
   configuring a digital-to-analog converter to generate a plurality of voltages; and
   comparing the plurality of voltages to the voltage on the node.

6. The method of claim 5 wherein the plurality of voltages are generated on a single output of the digital-to-analog converter, the plurality of voltages changing from an initial voltage to a final voltage, wherein the final voltage occurs after the plurality of voltages crosses the voltage on the node.

7. The method of claim 1 further comprising:
   generating a third voltage based on first digital bits, wherein the third voltage sets said threshold;
   comparing the third voltage to the voltage on the node when the current is being generated into said node, and in accordance therewith, turning off the current when the voltage on the node has said first voltage equal to said third voltage;
   generating a plurality of voltages based on a plurality of digital bits;
   comparing the plurality of voltages to the voltage on the node, wherein the second voltage is detected based on a crossover voltage of the plurality of voltages and the voltage on the node, the detected second voltage corresponding to second digital bits,
   wherein determining the resistance is based on a difference between the first digital bits and the second digital bits.

8. The method of claim 1 further comprising:
   detecting a time period between starting the current into the node and turning off the current when the voltage on the node meets the threshold; and
   turning off the current, increasing the threshold, and restarting the current if the time period is less than a first predefined time period.

9. The method of claim 1 further comprising:
   detecting a time period between starting the current into the node and turning off the current when the voltage on the node meets the threshold; and
   changing the threshold if the time period is outside a predefined time window.

10. The method of claim 1 further comprising waiting a period of time between turning off the current and detecting the second value of the voltage on the node.

11. A resistance sensing circuit comprising:
    a current source to generate a current into a node, wherein the node is coupled to a first terminal of a resistor, and wherein a second terminal of the resistor is coupled in series with a capacitance and a reference voltage;
    a threshold detection circuit coupled to the node and to the current source, wherein the threshold detection circuit turns off the current when a voltage on the node meets a threshold, the threshold corresponding to a first voltage on the node; and
    a voltage measurement circuit coupled to the node to detect a second voltage on the node after the current is turned off,
    wherein said current and a difference between the first voltage on the node and the second voltage on the node corresponds to a resistance value of said resistor.

12. The circuit of claim 11 wherein said resistance sensing circuit is an integrated circuit, and wherein the resistor and the capacitance are external to the integrated circuit.

13. The circuit of claim 12 wherein the integrated circuit is coupled to the resistor through a single pin of the integrated circuit.

14. The circuit of claim 11 wherein the threshold detection circuit comprises:
    a digital-to-analog converter configured to generate a third voltage, wherein the third voltage sets said threshold; and
    a comparator to compare the third voltage to the voltage on the node when the current is being generated into said node, and in accordance therewith, turning off the current when the voltage on the node has said first voltage equal to said third voltage.

15. The circuit of claim 11 wherein the voltage measurement circuit comprises:

a digital-to-analog converter configured to generate a plurality of voltages; and at least one comparator to compare the plurality of voltages to the voltage on the node after the current is turned off.

16. The circuit of claim 15 wherein the plurality of voltages are generated on a single terminal of the digital-to-analog converter that changes from an initial voltage and a final voltage, wherein the final voltage occurs after one of the plurality of voltages on the single terminal crosses the voltage on the node.

17. The circuit of claim 11 wherein the threshold detection circuit and the voltage measurement circuit comprise:

a digital-to-analog converter; and a comparator;

wherein, when the current is being generated into said node, the digital-to-analog converter generates a third voltage based on first digital bits, wherein the third voltage sets said threshold; and the comparator compares the third voltage to the voltage on the node, and in accordance therewith, turns off the current when the voltage on the node has said first voltage equal to said third voltage;

and wherein, after the current is turned off, the digital-to-analog converter generates a plurality of voltages based on a plurality of digital bits; and the comparator compares the plurality of voltages to the voltage on the node, wherein the second voltage is detected based on a crossover voltage of the plurality of voltages and the voltage on the node, the detected second voltage corresponding to second digital bits.

18. The circuit of claim 11 further comprising:

a timer to detect a time period between starting the current into the node and turning off the current when the voltage on the node meets the threshold; and wherein if the time period is less than a first predefined time period, the current is turned off, the threshold is increased, and the current is restarted.

19. The circuit of claim 11 further comprising:

a timer to detect a time period between starting the current into the node and turning off the current when the voltage on the node meets the threshold; and wherein if the time period is outside a predefined time window, the threshold is changed.

20. The circuit of claim 11 further comprising a timer to wait a period of time between turning off the current and detecting the second value of the voltage on the node.

* * * * *